United States Patent
Kim et al.

(10) Patent No.: US 9,753,332 B2
(45) Date of Patent: Sep. 5, 2017

(54) DISPLAY DEVICE AND MANUFACTURING METHOD THEREOF

(71) Applicant: Samsung Display Co., Ltd., Yongin-si, Gyeonggi-do (KR)

(72) Inventors: Byoung Yong Kim, Seoul (KR); Su Jung Huh, Yongin-si (KR); Jean Ho Song, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 302 days.

(21) Appl. No.: 14/604,089

(22) Filed: Jan. 23, 2015

(65) Prior Publication Data

US 2016/0018686 A1 Jan. 21, 2016

(30) Foreign Application Priority Data

Jul. 17, 2014 (KR) .......................... 10-2014-0090297

(51) Int. Cl.
*G02F 1/133* (2006.01)
*G02F 1/1339* (2006.01)
*H01L 51/52* (2006.01)
*H01L 27/32* (2006.01)
*G02F 1/1345* (2006.01)

(52) U.S. Cl.
CPC ........ *G02F 1/1339* (2013.01); *H01L 51/5246* (2013.01); *G02F 1/1345* (2013.01); *H01L 27/3276* (2013.01); *H01L 2251/558* (2013.01)

(58) Field of Classification Search
CPC ... G02F 1/1339; G02F 1/1345; H01L 51/5246

USPC .................................................. 349/33
See application file for complete search history.

(56) References Cited

U.S. PATENT DOCUMENTS

| | | | | |
|---|---|---|---|---|
| 2002/0080319 A1* | 6/2002 | Hagiwara | ............. | G02F 1/1339 349/153 |
| 2004/0263765 A1* | 12/2004 | Han | ............. | G02F 1/13394 349/155 |
| 2005/0041189 A1* | 2/2005 | Hong | ............. | G02F 1/13458 349/149 |
| 2010/0118250 A1* | 5/2010 | Fujikawa | ............. | G02F 1/1345 349/139 |
| 2013/0335123 A1 | 12/2013 | Choi et al. | | |

FOREIGN PATENT DOCUMENTS

| | | |
|---|---|---|
| JP | 2010-204236 | 9/2010 |
| KR | 1020000050912 | 1/2006 |
| KR | 1020120007355 | 5/2014 |

OTHER PUBLICATIONS

"Chip-on-glass LCD driver technology." NXP. Jul. 2012.

* cited by examiner

*Primary Examiner* — Lucy Chien
(74) *Attorney, Agent, or Firm* — Robert E. Bushnell, Esq.

(57) ABSTRACT

A display device includes: a first substrate including a first area and a second area disposed adjacent to the first area; a display element disposed on the first substrate to correspond to the first area; a second substrate disposed to face the first substrate with a display element interposed therebetween and configured to expose the second area; and a sealant interposed in at least one edge portion area between the first substrate and the second substrate and bonding the first substrate to the second substrate.

17 Claims, 11 Drawing Sheets

DISPLAY DEVICE AND MANUFACTURING METHOD THEREOF

CLAIM OF PRIORITY

This application claims priority to and the benefit of Korean Patent Application No. 10-2014-0090297, filed on Jul. 17, 2014, with the Korean Intellectual Property Office, the disclosure of which is incorporated herein in its entirety by reference.

BACKGROUND

Field

The present disclosure of invention relates to a liquid crystal display device designed to minimize a non-display area and to a method of manufacturing the liquid crystal display device.

Description of the Related Art

Liquid crystals have flexible properties of liquid and properties of solid having a regular crystalline molecular arrangement. The liquid crystals are optically anisotropic and thus, upon applying voltage, liquid crystal molecules are rearranged according to a direction of an electric field. A liquid crystal display (LCD) device is a flat panel display device using these characteristics of the liquid crystals so as to display figures, letters, or drawings.

By virtue of being capable of adopting a battery as a power source and as becoming light, thin, short, and small, the LCD devices have been widely used in a laptop computer, a mobile phone, a smart phone, a table PC, and the like.

In general, the LCD devices include a first substrate, a driving unit and a liquid crystal layer disposed on the first substrate, a second substrate disposed to face the first substrate with the liquid crystal layer interposed therebetween and including a color filter disposed thereon, and a sealant bonding the first substrate to the second substrate. Further, the LCD device may further include a COG (Chip-on-Glass) driving element on the first substrate.

The COG driving element is mounted on the LCD device by a process of applying heat and pressure on the COG driving element to connect the COG driving element to wirings of the substrate. In the mounting process, the substrate may be bent by the heat and pressure applied on the COG driving element and the deformed substrate may lead to light leakage to a non-display area.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

The present disclosure of invention is directed to an LCD device designed to minimize substrate deformation caused in a mounting process of a COG element.

According to an embodiment of the present invention, a display device may include: a first substrate including a first area and a second area adjacent to the first area; a display element disposed on the first substrate to correspond to the first area; a second substrate disposed to face the first substrate with a display element interposed therebetween and configured to expose the second area; and a sealant interposed in at least one edge portion area between the first substrate and the second substrate and bonding the first substrate to the second substrate.

The sealant may have a large width in an area adjacent to a border line between the first area and the second area compared to a width at edge portions of the first substrate and the second substrate.

The display device may further include a COG driving element mounted on the second area of the first substrate.

The display element may include a liquid crystal layer.

The sealant may include a non-light-transmissive material.

The display element may include an organic light emitting diode.

The sealant may include frit.

The sealant may have a width of at least 0.5 mm at the border line between the first area and the second area.

At least one edge portion of the sealant may be disposed on the same surface with the edge portions of the first substrate and the second substrate.

The sealant may have different widths for the respective edge portion areas of the second substrate.

According to an embodiment of the present invention, a method of manufacturing a display device may include: forming wirings on a first area and a second area of a first substrate; forming a display element on the first area of the first substrate; coating a sealant around an area on which the display element is formed; disposing a second substrate on the sealant; curing the sealant; and cutting the sealant substantially in parallel with an extending direction of at least one cross-section of the first substrate that is not adjacent to the second area.

The cutting of the sealant may include simultaneously cutting the first substrate, the second substrate, and the sealant.

The sealant may be cured by one selected from UV curing, thermal curing, and laser curing.

The display device may further include thermally compressing the COG driving element on wirings of the first substrate.

A first pressurizing pad may apply pressure on the COG driving element and a second pressurizing pad may apply pressure on a lower portion of the first substrate in the thermally compressing.

The first pressurizing pad and the second pressuring pad may be may be set at different temperatures from each other.

According to embodiments of the present invention, a sealant is widely formed in an area adjacent to a COG driving element of an LCD device, such that heat that is applied on a substrate when the COG driving element is mounted on the display device is transferred to a facing substrate through the sealant. Accordingly, the heat is rapidly dispersed, thereby reducing a temperature deviation exhibited on substrate when the COG driving element is mounted on the display device.

Further, a sealant disposed in areas except for a sealant area adjacent to the COG driving element is cut in parallel with a cross-section of the substrate, thereby realizing a display device including a narrow bezel by minimizing a non-display area.

According to an embodiment of the present invention, a display device may include a first substrate having a major surface including a first area and a second area adjacent to the first area, a display element disposed on the first area of the first substrate, a second substrate disposed to face the major surface of the first substrate with the display element interposed therebetween and configured to expose the second area, and a sealant interposed between the first substrate and the second substrate and bonding the first substrate to the second substrate. A portion of the sealant may be flush with a side surface of the first and second substrates.

The sealant may comprise a first portion disposed adjacent to a border line between the first area and the second, a second portion substantially parallel to the first portion, and a third portion and a fourth portion substantially parallel to each other and extending between the first portion and the second portion, and the second, third, and fourth portions of the sealant may be respectively flush to side surfaces of the first and second substrates.

A width of the first portion may be less than a width of one of the second, third, and fourth portions.

A width of one of the second portion, third portion, and fourth portion may be different from a width of another of the second portion, third portion, and fourth portion.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, embodiments of the present disclosure of invention will be described in more detail with reference to the accompanying drawings.

Although the present invention can be modified in various manners and have several embodiments, specific embodiments are illustrated in the accompanying drawings and will be mainly described in the specification. However, the scope of the embodiments of the present invention is not limited to the specific embodiments and should be construed as including all the changes, equivalents, and substitutions included in the spirit and scope of the present invention.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some of the parts which are not associated with the description may not be provided in order to specifically describe embodiments of the present invention, and like reference numerals refer to like elements throughout the specification.

Hereinafter, configurations and performances of a display device according to an embodiment of the present invention will be described in detail with reference to the attached drawings.

Figure 1:
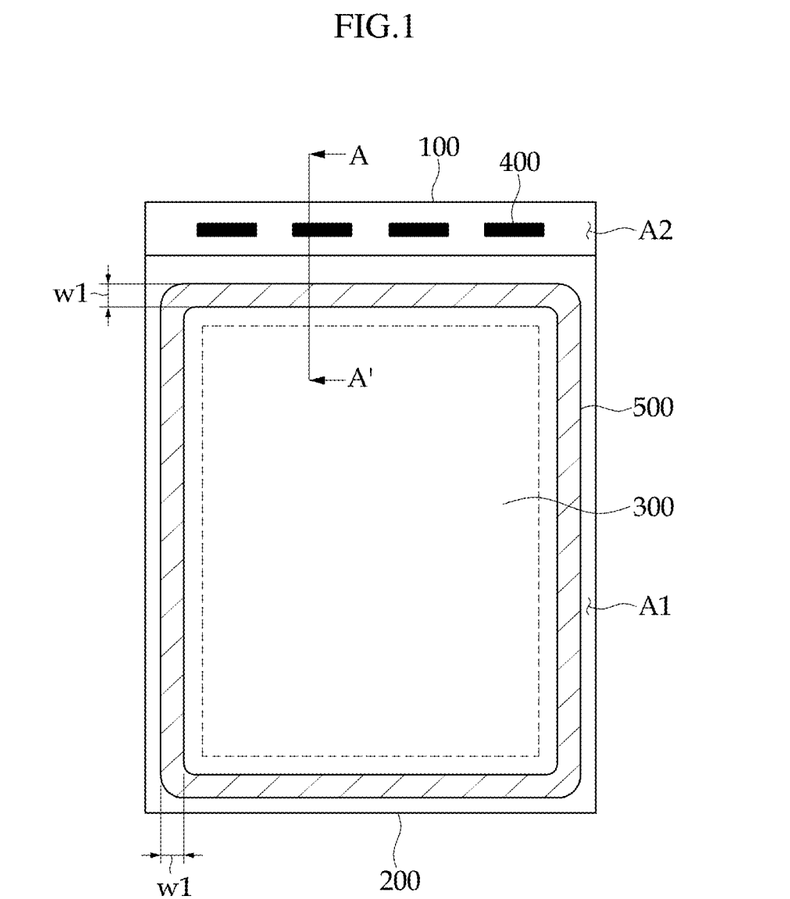
FIG. 1 is a plan view illustrating an LCD device.
Figure 2:
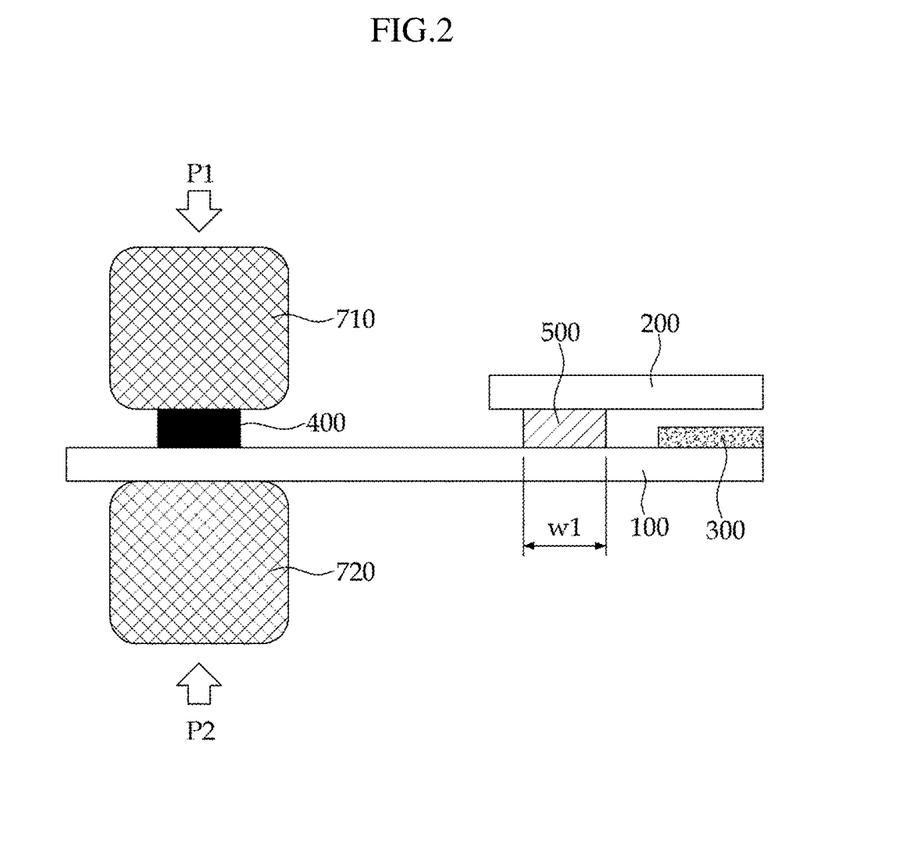
FIG. 2 is a schematic cross-sectional view illustrating a process of mounting a COG driving element on a substrate of an LCD device.
Figure 3:
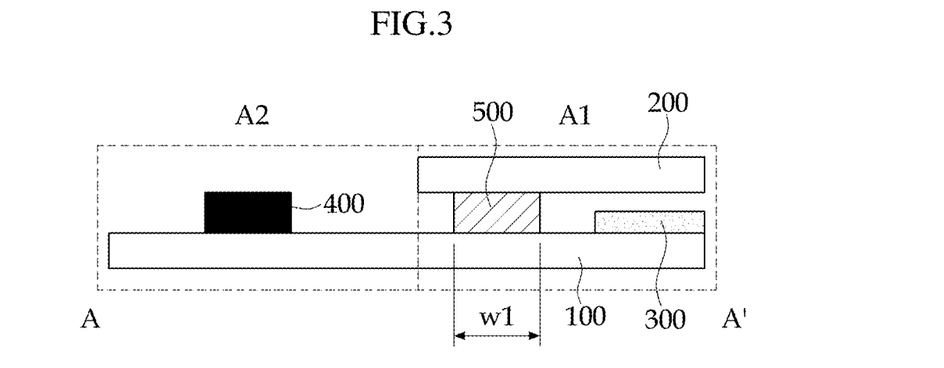
FIG. 3 is a cross-sectional view illustrating an LCD device on which the COG driving element is mounted.

FIG. 1 is a plan view illustrating an LCD device, FIG. 2 is a schematic cross-sectional view illustrating a process of mounting a COG driving element on a substrate of an LCD device, and FIG. 3 is a cross-sectional view illustrating an LCD device on which the COG driving element is mounted.

Hereinafter, an LCD device that is generally used will be described with reference to FIGS. 1 to 3.

As illustrated in FIGS. 1 to 3, the LCD device includes a first substrate 100, a second substrate 200, an LCD element 300, a COG driving element 400, and a sealant 500.

The first and the second substrates 100 and 200 are insulating substrates including glasses, polymers, stainless steel, and the like. At least one of the first and the second substrates 100 and 200 is formed of a light-transmissive material. The LCD element 300 and the COG driving element 400 are disposed on the first substrate and electrically connected to each other by wirings (not illustrated) formed on the first substrate 100. The second substrate 200 is disposed to face the first substrate 100 with the LCD element 300 interposed therebetween. The sealant 500, which bonds the first substrate 100 to the second substrate 200, is configured to cover the LCD element 300 in order to prevent infiltration of moisture and gas from the outside. Further, the sealant 500 may also function to prevent light leakage from the light source of the LCD device to the side surfaces of the first and the second substrates 100 and 200.

The sealant 500 may include materials which can be cured by irradiating ultraviolet rays (UV), laser beam, visible light, and the like. The sealant 500 may include, for example, epoxy acrylate-based resins, polyester acrylate-based resins, urethane acrylate-based resins, polybutadine acrylate-based resins, silicon acrylate-based resins, alkyl acrylate-based resins, and the like. These may be used singly or in combination with each other. In some embodiments, the sealant 500 may include non-light-transmissive materials, such as carbon, in order to prevent backlight of the LCD from being outputted toward the non-display area through the sealant. A first area A1 refers to an area which faces the first substrate 100 and the second substrate 200, respectively. A second area A2 refers to an area on the first substrate 100 which is adjacent to the first area and on which the COG driving element is disposed. As shown in FIGS. 1 and 3, the first area A1 is an area which the first substrate 100 and the second substrate 200 overlap with each other, and the second area A2 is a remaining area of the first substrate 100 which does not overlap the second substrate 200.

The first area A1 includes a display area displaying light by an operation of the LCD element 300. The second area A2 is adjacent to the first area A1 and refers to a part of a surface of the first substrate 100 exposed to the outside. Wirings connected to the display element 300 are disposed on the second area A2 and a circuit chip, such as the COG driving element 400, or end portions of wirings are also disposed on the second area A2.

FIG. 2 illustrates a process of mounting the COG driving element 400 on the second area A2. A first pressurizing pad 710 is firstly disposed on the COG driving element 400 and a second pressurizing pad 720 is disposed under the COG driving element 400. The first and the second pressurizing pads 710 and 720 respectively apply pressures P1 and P2 on the COG driving element 400 and the first substrate 100.

The pressurizing pads 710 and 720 may further include a heating member. As applying heat and pressure at the same time, the COG driving element 400 and wirings formed on the first substrate 100 are electrically connected. When applying heat and pressure, the respective first and second pressurizing pads 710 and 720 may be set at different temperatures from each other. For example, the first pressurizing pad 710 may apply pressure P1 at 150° C., while the second pressurizing pad 720 may apply pressure P2 at 90° C.

FIG. 3 is a cross-sectional view illustrating the LCD device on which the COG driving element 400 is mounted. Along a line A-A' shown in FIG. 1, a part of the first area A1 comprising the first and the second substrates 100 and 200 and the second area A2 adjacent to the first area A1 are illustrated. The first area A1 includes the LCD element 300 and the sealant 500 configured to surround the LCD element 300 and bond the first substrate 100 to the second substrate 200.

Referring to FIGS. 1 to 3, the sealant 500 is disposed between the first and the second substrates 100 and 200, surrounds the LCD element 300 with a predetermined gap therebetween, and is disposed along edge portions of the first and the second substrates 100 and 200 to bond the first substrate 100 to the second substrate 200. The sealant 500 is cured after the substrates are bonded.

The sealant 500 has the same width W1 in edge portions of the first area A1. Further, the width of the sealant is measured with respect to a surface in contact with the first substrate 100. An area of the sealant that is in contact with the first substrate 100 may vary in a direction perpendicular to the second substrate 200. The width of the sealant refers to an average width of the sealant and does not mean a maximum width of the sealant at a certain point in contact with the first substrate.

Figure 4:
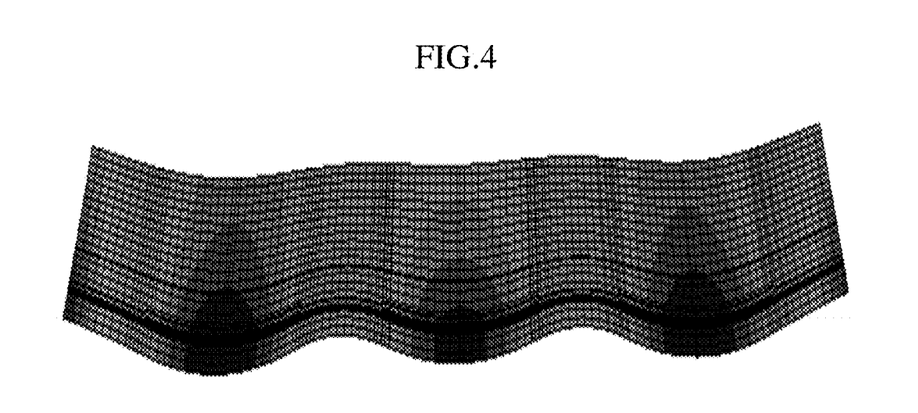
FIG. 4 is a graph showing a measurement result of a substrate deformation (bending) caused by the COG driving element mounting process.

FIG. 4 is a graph showing a measurement result of a substrate deformation (bending) caused by the COG driving element mounting process.

The result of FIG. 4 is measured in a condition where the first pressurizing pad 710 is heated to 150° C. and the second pressurizing pad 720 is heated to 90° C. A 0.2 T glass is used as the first and the second substrates and the sealant has the same width of 0.5 mm in all areas. In such a condition, a height of the substrate is measured after the COG driving element is heated, pressed, and mounted. FIG. 4 shows that the substrate deformation appears most in areas having a dark color where the COG driving element is mounted.

Figure 5:
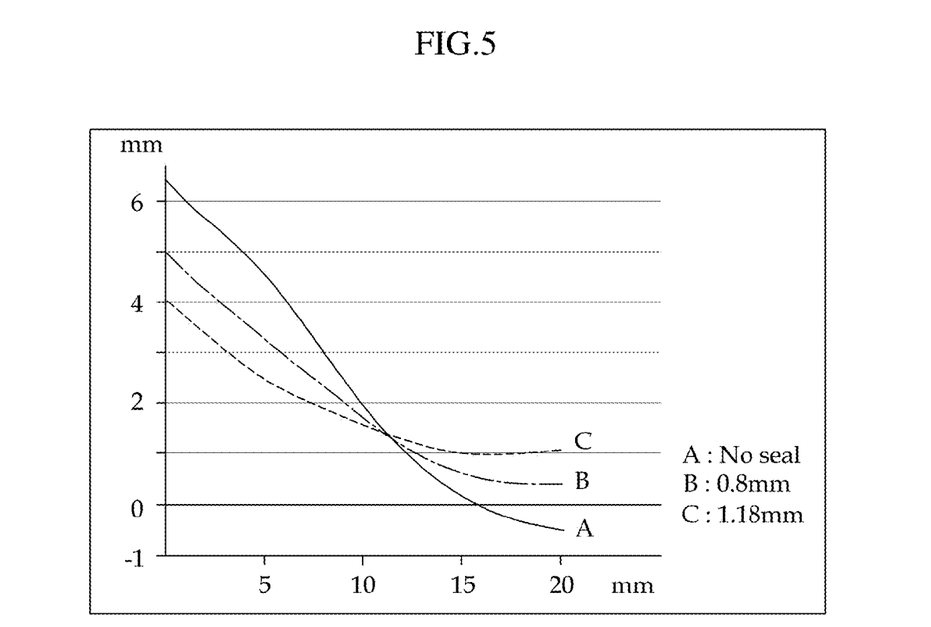
FIG. 5 is a comparison graph comparing substrate deformations after mounting the COG driving element.

FIG. 5 is a comparison graph comparing substrate deformations after mounting the COG driving element. The result of FIG. 5 is measured in a condition where the first pressurizing pad 710 is heated to 150° C. and the second pressurizing pad 720 is heated to 90° C. A 0.2 T glass is used as the first and the second substrates. In addition, the respective results are obtained under conditions of not using a sealant, using a sealant having a width of 0.8 mm, and using a sealant having a width of 1.8 mm. A horizontal axis of FIG. 5 represents a distance from the edge portion of the substrate and a vertical axis of FIG. 5 represents a measured height of the deformed substrate. Referring to FIG. 5, a panel without a sealant shows the most severe substrate deformation, while a panel C including the sealant having the width of 1.8 mm shows the least severe substrate deformation. Therefore, FIG. 5 shows that, as the width of the sealant increases, the substrate becomes less bent.

Figure 6:
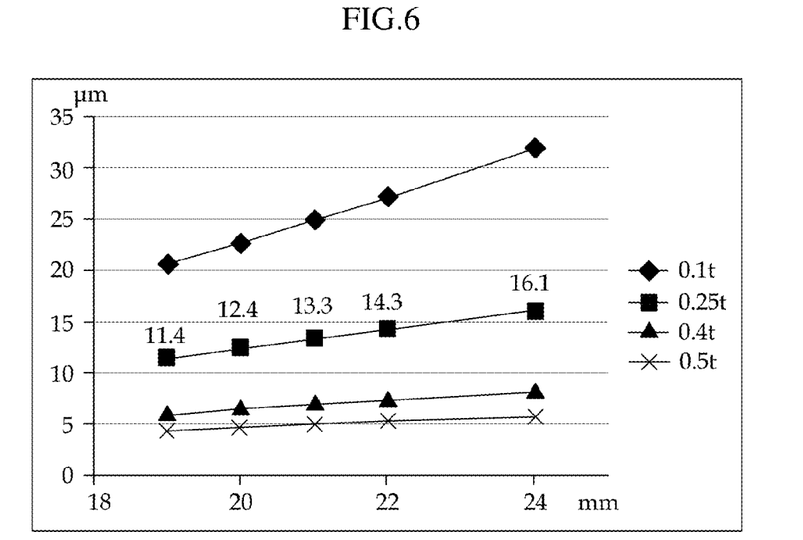
FIG. 6 is a comparison graph comparing lengths of the COG driving element and widths of the substrate.

FIG. 6 is a comparison graph comparing lengths of the COG driving element and widths of the substrate.

A horizontal axis of FIG. 6 represents a length of the COG driving element and a vertical axis of FIG. 6 represents a maximum substrate deformation value. FIG. 6 shows results obtained under the condition where the COG driving elements respectively having lengths of 19 mm, 20 mm, 21 mm, 22 mm, and 24 mm are mounted on the substrate having thicknesses of 0.1 t, 0.25 t, 0.4 t, and 0.5 t.

The COG driving element having a length of 19 mm is mounted on four substrates having thicknesses of 0.1 t, 0.25 t, 0.4 t, and 0.5 t, respectively. The mounting condition is the same as the condition described for FIG. 4. The 0.1 t substrate shows bending of about 20 μm. The 0.25 t substrate shows bending of about 11.4 μm and the 0.5 t substrate shows bending of less than 5 μm. That is, as the thickness of the substrate increases, the substrate deformation is reduced. The COG driving element having a length of 21 mm is measured in the same condition. The 0.1 t substrate shows a maximum bending of about 25 μm and the 0.25 t substrate shows bending of about 13.3 μm. Further, the 0.5 t substrate shows bending of about 5 μm. The COG driving element having a length of 24 mm is measured in the same condition. The 0.1 t substrate shows a maximum bending of about 32 μm, which is increased by 50% compared to the COG driving element having a length of 19 mm. The 0.25 t substrate shows bending of about 16.1 μm and the 0.5 t substrate shows bending of about 5.5 μm.

FIG. 6 shows that as the length of the COG driving element increases, the substrate becomes bent more severely, while as the thickness of the substrate increases, the bending phenomenon of the substrate is improved.

Figure 7:
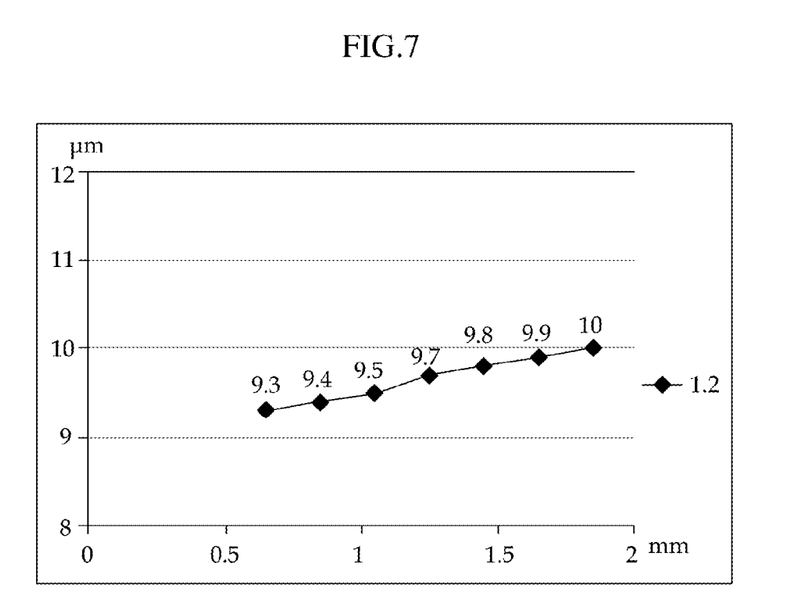
FIG. 7 is a comparison graph comparing substrate deformations depending on a distance between the COG driving element and a sealant adjacent to a border line between a first and a second areas.

FIG. 7 is a comparison graph comparing substrate deformations depending on a distance between the COG driving element and a sealant adjacent to a border line between the first and the second areas. When a sealant having a width of 1.2 mm is used, as the distance between the COG driving element and the sealant increases from 0.65 mm to 1.85 mm, the maximum amount of bending is increased from 9.3 μm to 10 μm. As the distance between the COG driving element and the sealant decreases, the substrate is less bent.

Figure 8:
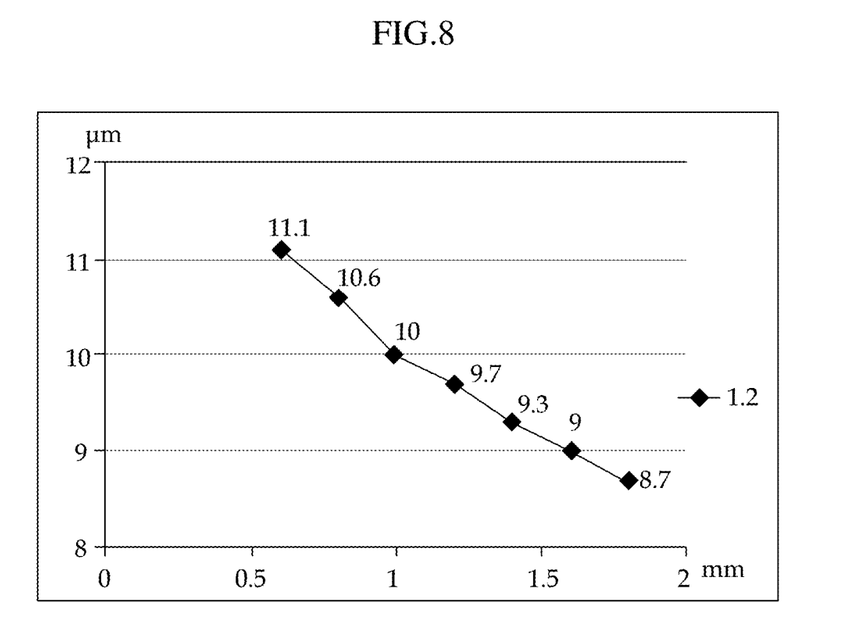
FIG. 8 is a comparison graph comparing substrate deformations depending on a width of a sealant.

FIG. 8 is a comparison graph comparing substrate deformations depending on widths of the COG driving element and the sealant.

Referring to FIG. 8, as the width of the sealant increases from 0.6 mm to 1.8 mm, the maximum amount of bending is reduced from 11 μm to 8.7 μm.

Referring to FIGS. 4 to 8, it is assumable that the thickness of the substrate, the distance between the sealant and the COG driving element, and the width of the sealant affect the substrate bending phenomenon. In order to reduce the substrate deformation, it is required to increase the thickness of the substrate or the width of the sealant. However, it may be challenging to increase the thickness of the substrate in order to reduce the substrate deformation, because it leads to increases in cost and weight.

In order to achieve a thin substrate and reduce substrate deformation at the same time, it is desirable to increase the width of the sealant. However, as the width of the sealant is increased, non-display areas may be extended to areas beyond the COG-driving-element-mounted areas, thereby increasing the total substrate area.

It may be possible to coat the sealant to have a larger width only in the first area A1 adjacent to the second area A2 where the substrate is usually bent. However, it is difficult to form a sealant to have a larger width only in a part of area during a coating process where the sealant is coated between the first substrate 100 and the second substrate 200. That is, in order to change the width of the sealant when coating the sealant on the substrate, a form of a nozzle supplying the sealant material, a pressure applied on the nozzle, and a moving velocity of the nozzle should be adjusted in a single coating process. Further, when the width of the sealant is differently coated, a crack may be caused and the display device may be damaged in an area where the width of the sealant is severely changed in a curing process.

Embodiments of the present invention provide a sealant that has a larger width in an area adjacent to the COG-driving-element-mounted area and has a smaller width in other areas. The sealant having a smaller width may be formed by removing a part of the sealant in a width direction by a cutting process after the sealant is cured.

Figure 9:
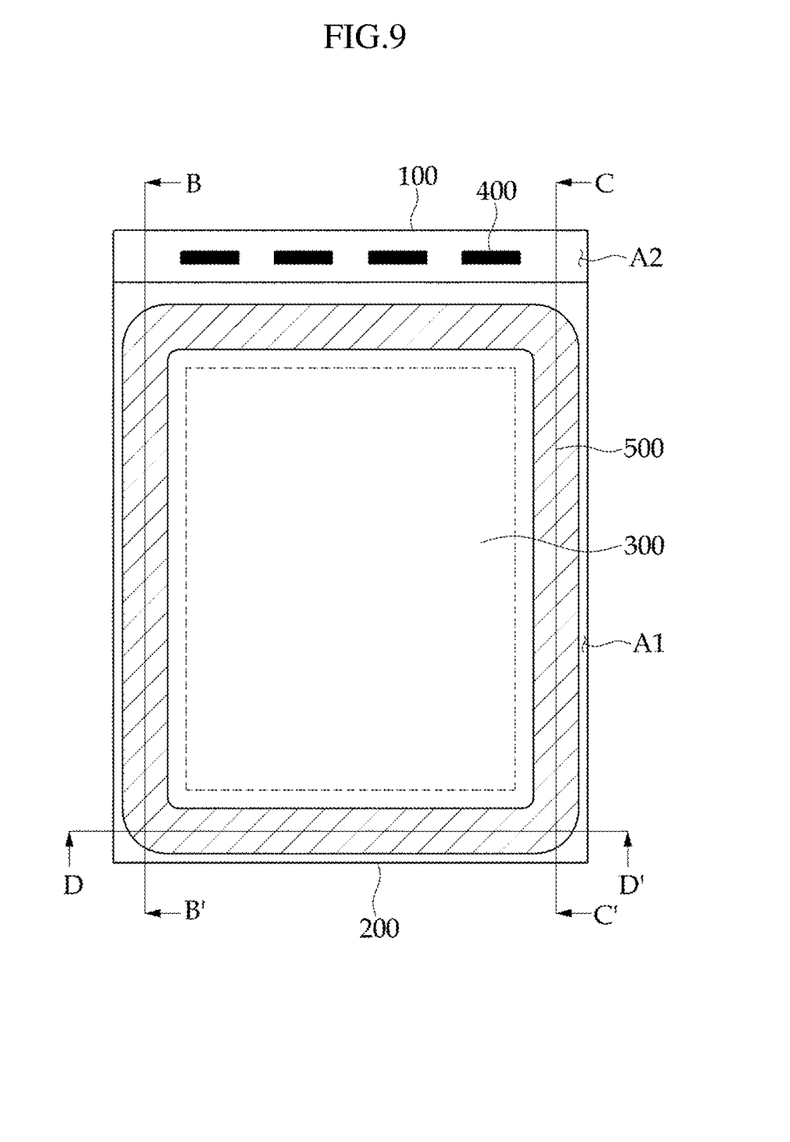
FIG. 9 is a conceptual view illustrating a cutting of the LCD device according to an embodiment of the present invention.
Figure 10:
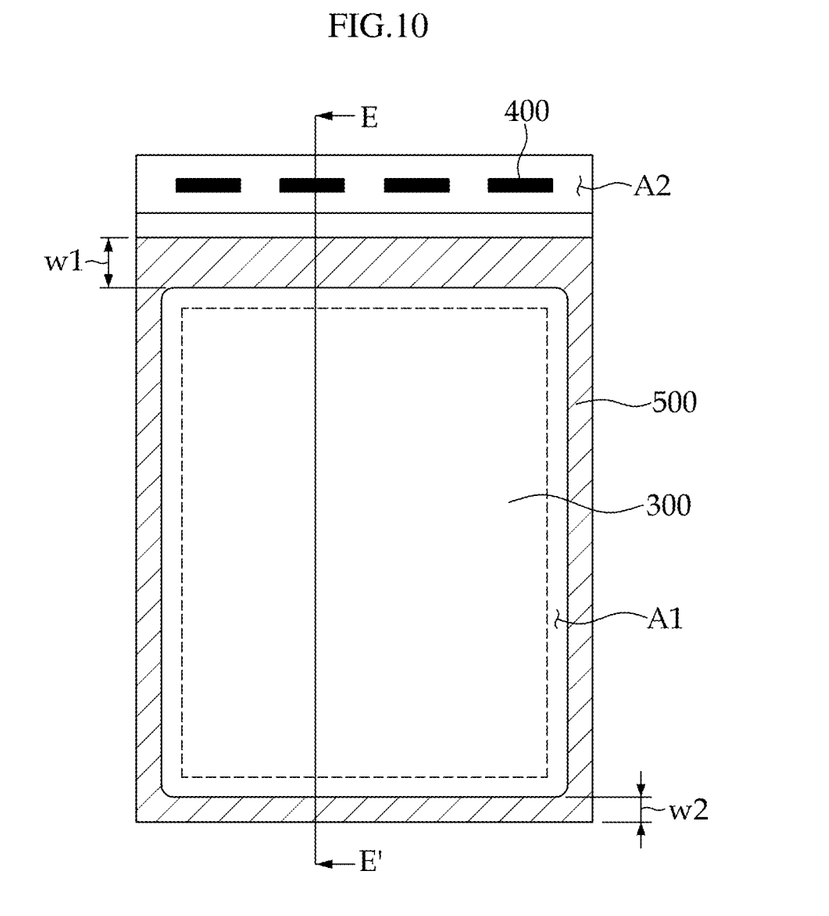
FIG. 10 is a plan view illustrating an LCD device of FIG. 9.
Figure 13:
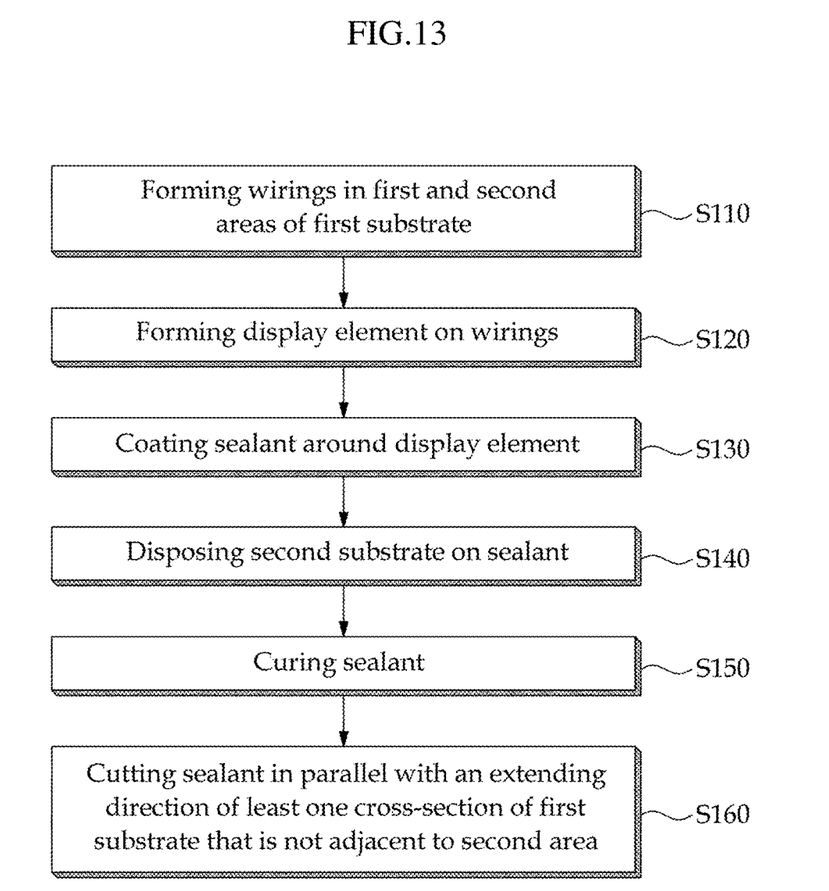
FIG. 13 is a flow chart illustrating a method of manufacturing a LCD device.

FIGS. 9 and 10 are conceptual views for explaining the LCD device according to an embodiment of the present invention. FIG. 13 is a flow chart illustrating a method of manufacturing the LCD device.

FIG. 9 is a conceptual view illustrating a cutting of the LCD device according to an embodiment of the present invention.

In FIG. 9, the LCD element 300 is disposed on the first substrate 100 in the first area A1. The sealant 500 surrounds the display element 300 and bonds the first substrate 100 to the second substrate 200. The sealant 500 seals the display element 300 to protect from the outside.

The liquid crystal display element of FIGS. 9 and 10 is manufactured by following processes illustrated in FIG. 13: forming wirings in the first and the second areas of the first substrate (S110); forming the display element on the wirings (S120); coating the sealant around the display element (S130); disposing the second substrate on the sealant (S140); curing the sealant (S150); and cutting the sealant in parallel with an extending direction of at least one cross-section of the first substrate that is not adjacent to the second area (S160).

Figure 14:
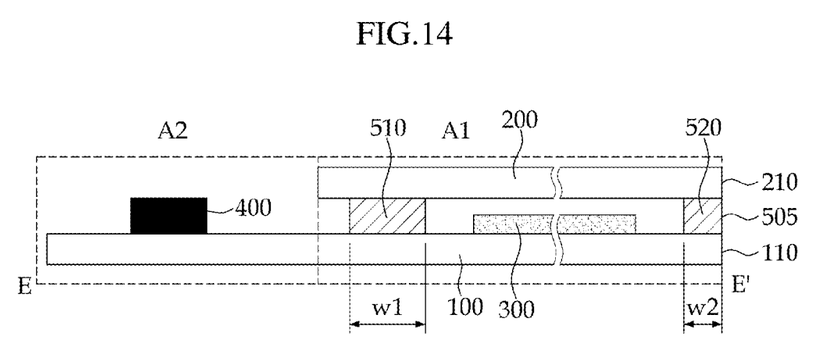
FIG. 14 is a schematic cross-sectional view illustrating a LCD device taken along line E-E' of FIG. 10.

The sealant is cut along cutting-reference lines B-B', C-C', and D-D' of FIG. 9. FIG. 10 is a conceptual plan view illustrating an LCD device of FIG. 9 after the sealant is cut. FIG. 14 is a schematic cross-sectional view illustrating an LCD device taken along line E-E' of FIG. 10

A specific order of the processes may be adjustable depending on whether the display element 300 is an LCD element or an OLED.

The COG driving element 400 of FIG. 9 is connected to the wirings of the first substrate 100 by a thermo-compression process. When the COG driving element 400 is thermally compressed, heat and pressure are concentrically applied on an area where the COG driving element 400 is disposed. The first substrate 100 may be partly bent because of the heat and pressure concentrated on a certain area. In this case, the bending of the substrate may be reduced by forming the sealant to have a larger width in a surface adjacent to a border line between the first and the second areas. In order to keep the substrate bending to less than 10 μm, it is desirable that the sealant adjacent to a border line between the first and the second areas has a width of 5 mm~2.5 mm in a glass substrate having a thickness of 0.2 T. Further, it is desirable that the sealant has a width of at least 1.2 mm in a glass substrate having a thickness of 0.1 T.

On condition that the thickness of the glass substrate is thick enough, the substrate itself has a high thermal capacity, and thus the first substrate may not be severely bent by the heat applied from the compression process of the COG driving element. However, in a case where the thickness of the glass substrate is thin, the substrate itself has a low thermal capacity, and thus the heat applied on the first substrate should be conducted through most adjacent sealant to the second substrate to be dispersed.

A desired width of the sealant may be adjustable depending on the thermal conductivity and thickness of glasses forming the first and the second substrates and the thermal conductivity of a sealant material.

Lines B-B', C-C', and D-D' of FIG. 9 represents a hypothetical cutting reference line to cut the substrate. The cutting reference line shown in FIG. 9 is determined with respect to a central portion of the sealant. The LCD device is usually cut by a scribing method. The scribing method refers to a cutting method where a scribing line is formed on a surface of the substrate when cut. According to an embodiment of the present invention, the scribing line is determined along the hypothetical cutting reference line. The scribing line refers to a crack formed in a direction perpendicular to a surface of the glass. Metal alloys and diamond, having excellent hardness, attached on a cutting edge of the scriber is generally used to form the scribing line. The substrate cut by the scribing process has a subtle trace of the edge of the cutter.

The scribing process is described to cut the display substrate according to an embodiment of the present invention but it is obvious that other substrate cutting methods, such as laser-cutting and water-jet cutting methods, can also be used.

It is desirable that the substrate-cutting process according to an embodiment of the present invention is performed after the COG driving element is mounted. After the substrate is cut, an area of the first substrate for mounting the COG driving element is reduced and the thermal capacity of the substrate is thus reduced, such that the substrate is more likely to suffer a deformation. However, the order of the processes may be adjustable and may be selected depending on yields of the respective processes.

FIG. 10 is a plan view illustrating an LCD device of FIG. 9. In the LCD device of FIG. 10, the sealant has a larger width in an area adjacent to the border line of the first and the second areas compared to the edge portions of the first and the second substrates. That is, a width W1 of the sealant adjacent to the border line of the first and the second areas has a width, for example, twice as large as a width W2 of the sealant of the edge portions of the first and the second substrates. In order to transmit heat, the width W1 of the sealant adjacent to the COG driving element may be manufactured largely. At the same time, in order to provide a display device including a narrow bezel, the non-display may be reduced by cutting the sealant area along a cutting reference line in parallel with a cross-section of the substrate.

Referring to FIG. 10, the sealant has the width W1 of at least 0.5 mm on a border line of the first and the second areas and has the width W2 smaller than the width W1 at the edge portions of the first and the second substrate.

Figure 12:
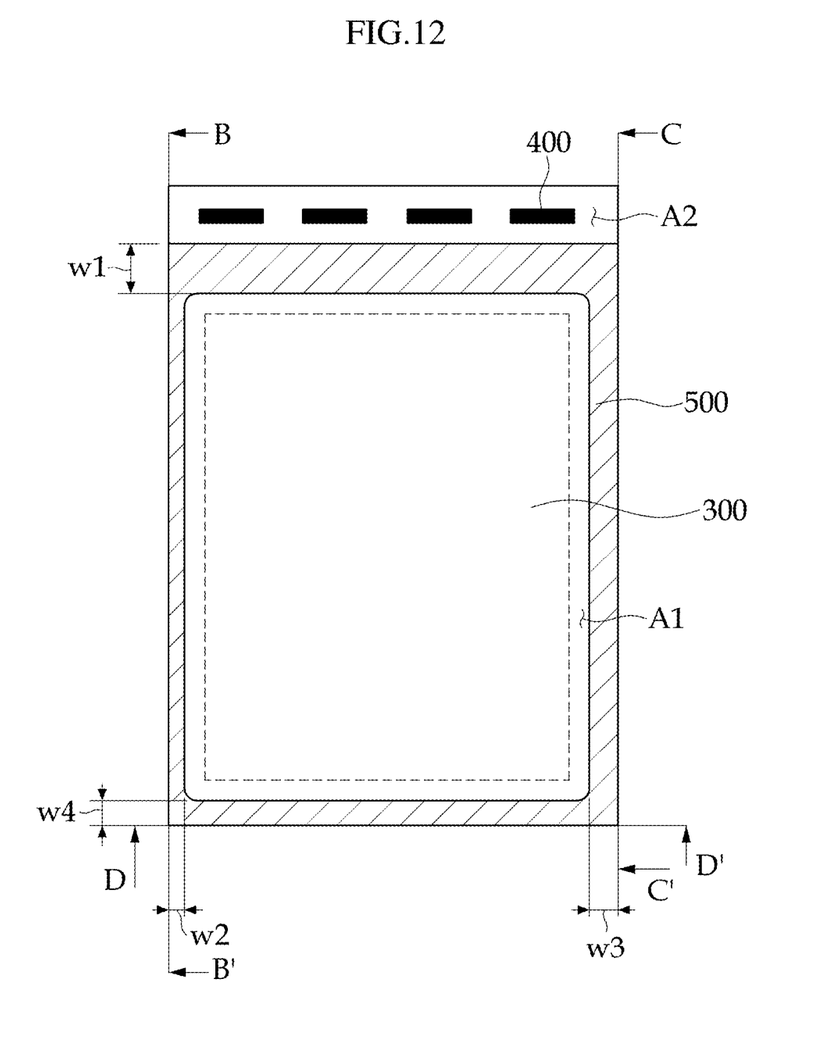
FIG. 12 is a plan view illustrating the LCD device of FIG. 11.

After substrate cutting process, as shown in FIGS. 10 and 12, the sealant 500 includes a first portion 510 disposed between the display element 300 and the COG driving element 400, a second portion 520 disposed opposite and substantially parallel to the first portion 510 at an edge of the first and second substrates 100 and 200, a third portion 530 extending between the first and second portions 510 and 520, and a fourth portion 540 disposed substantially parallel to the third portion 530 and connecting the first and second portions 510 and 520. After substrate cutting, side surfaces of the first and second substrates 100 and 200 along which the second, third, and fourth portions 520, 530, and 540 are formed, are flush with a corresponding side surface of the portions 520, 530, and 540. As shown in FIG. 12, a side surface 110 of the first substrate 100 and a side surface 210 of the second substrate are flush with a side surface 505 of the second portion 520.

According to an embodiment of the present invention, it is described that the width of the sealant area of the LCD device adjacent to the border line of the first and the second areas is twice as large as the width of the sealant at the edge portions of the first and the second substrates. However, the width of the sealant adjacent to the border line of the first and the second areas may be more than twice as large as the width of the edge portions of the first and the second substrates depending on a structure of the panel and the configurations of peripheral devices.

It is desirable that the substrate and the sealant are simultaneously cut by the same cutter after the sealant is cured. The edge portions of the first and the second substrates and the sealant are disposed on the same surface. The three-layer structure of the first and the second substrates and the sealant have a higher structural rigidity compared to a conventional structure having a gap between substrates, which reduces the possibility of damage. Therefore, having three-layer structure allows reinforcing member of the bezel unit to employ a structure having less rigidity than the conventional bezel unit.

According to an embodiment of the present invention, the width W1 of the sealant adjacent to the border line of the first and the second areas may be increased. Accordingly, an LCD device including a narrow bezel improved in the bending phenomenon can be realized.

Figure 11:
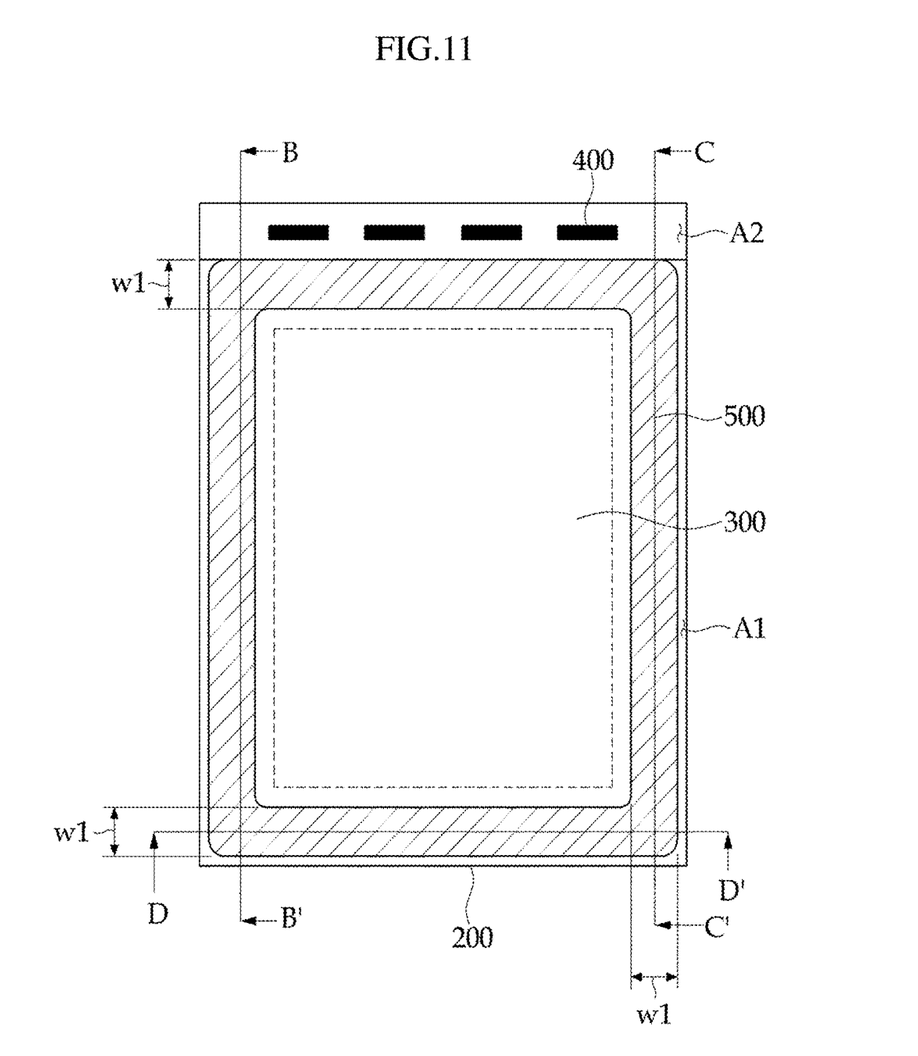
FIG. 11 is a conceptual view illustrating a cutting of the LCD device according to another embodiment of the present invention.

FIG. 11 is a conceptual view illustrating a cutting of the LCD device according to another embodiment of the present invention; and FIG. 12 is a plan view illustrating the LCD device of FIG. 11.

Referring to FIG. 11, the cutting reference lines B-B', C-C', and D-D' according to another embodiment of the present invention are respectively formed in different positions in respective edge portion areas of the sealant except for the edge portion adjacent to the border line between the first and the second areas. Therefore, the sealant has different widths for the respective edge portion areas of the second substrate. Different widths of the sealant may be selectively adopted depending on product design and use environment of products using the LCD device.

Meanwhile, the LCD device is described as a display device according to an embodiment of the present invention, but embodiments of the present invention may be applied to a flat display device employing the curing process of a sealant. Thus, embodiments of the present invention may be applied to an OLED device as in the LCD device, except the sealant of the OLED device is subject to a plastic hardening.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display device, comprising:
    a first substrate including a first area and a second area adjacent to the first area;
    a display element disposed on the first substrate to correspond to the first area;
    a second substrate disposed to face the first substrate with a display element interposed therebetween and configured to expose the second area; and
    a sealant interposed in at least one edge portion area between the first substrate and the second substrate and bonding the first substrate to the second substrate,
    wherein the sealant has a large width in an area adjacent to a border line between the first area and the second area compared to a width at edge portions of the first substrate and the second substrate.

2. The display device of claim 1, further comprising a COG (Chip-on-Glass) driving element mounted on the second area of the first substrate.

3. The display device of claim 1, wherein the display element comprises a liquid crystal layer.

4. The display device of claim 3, wherein the sealant comprises a non-light-transmissive material.

5. The display device of claim 1, wherein the display element comprises an organic light emitting diode.

6. The display device of claim 5, wherein the sealant comprises frit.

7. The display device of claim 1, wherein the sealant has a width of at least 0.5 mm at the border line between the first area and the second area.

8. The display device of claim 1, wherein at least one edge portion of the sealant is disposed on the same surface with the edge portions of the first substrate and the second substrate.

9. The display device of claim 1, wherein the sealant has different widths for the respective edge portion areas of the second substrate.

10. A method of manufacturing a display device, the method comprising:
    forming wirings on a first area and a second area of a first substrate;
    forming a display element on the first area of the first substrate;
    coating a sealant around an area on which the display element is formed, a first portion of the sealant being adjacent to the second area of the first substrate;
    disposing a second substrate on the sealant;
    curing the sealant; and cutting a portion of the sealant along a substantial portion of a perimeter of the display element, where the portion of the sealant that is cut is not the first portion and the first portion of the sealant is not cut.

11. The method of claim 10, wherein the cutting of the sealant comprises simultaneously cutting the first substrate, the second substrate, and the sealant.

12. The method of claim 10, wherein the sealant is cured by one selected from UV curing, thermal curing, and laser curing.

13. The method of claim 10, further comprising thermally compressing the COG driving element on wirings of the first substrate.

14. The method of claim 13, wherein a first pressurizing pad applies pressure on the COG driving element and a second pressurizing pad applies pressure on a lower portion of the first substrate in the thermally compressing.

15. The method of claim 14, wherein the first pressurizing pad and the second pressuring pad are set at different temperatures from each other.

16. A display device, comprising:
a first substrate having a major surface including a first area and a second area adjacent to the first area;
a display element disposed on the first area of the first substrate;
a second substrate disposed to face the major surface of the first substrate with the display element interposed therebetween and configured to expose the second area; and
a sealant interposed between the first substrate and the second substrate and bonding the first substrate to the second substrate, a portion of the sealant being flush with a side surface of the first and second substrates,
wherein the sealant comprises a first portion disposed adjacent to a border line between the first area and the second, a second portion substantially parallel to the first portion, and a third portion and a fourth portion substantially parallel to each other and extending between the first portion and the second portion, and wherein the second, third, and fourth portions of the sealant are respectively flush to side surfaces of the first and second substrates, and wherein a width of the first portion is less than a width of one of the second, third, and fourth portions.

17. The display device of claim 16, wherein a width of one of the second portion, third portion, and fourth portion is different from a width of another of the second portion, third portion, and fourth portion.

* * * * *